United States Patent
Pal et al.

(10) Patent No.: US 8,119,464 B2
(45) Date of Patent: Feb. 21, 2012

(54) FABRICATION OF SEMICONDUCTORS WITH HIGH-K/METAL GATE ELECTRODES

(75) Inventors: Rohit Pal, Fishkill, NY (US); Stephan Waidmann, Wappingers Falls, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 205 days.

(21) Appl. No.: 12/561,638

(22) Filed: Sep. 17, 2009

(65) Prior Publication Data

US 2011/0062519 A1 Mar. 17, 2011

(51) Int. Cl.
*H01L 21/84* (2006.01)

(52) U.S. Cl. .. 438/151; 438/287; 438/300; 257/E21.561

(58) Field of Classification Search .......... 438/585–595, 438/287, 300, 151–166; 257/E21.561
See application file for complete search history.

(56) References Cited

U.S. PATENT DOCUMENTS

| | | | | |
|---|---|---|---|---|
| 5,013,398 | A * | 5/1991 | Long et al. | 438/714 |
| 6,020,024 | A * | 2/2000 | Maiti et al. | 438/287 |
| 6,048,756 | A * | 4/2000 | Lee et al. | 438/151 |
| 6,110,812 | A * | 8/2000 | Ho et al. | 438/592 |
| 6,143,673 | A * | 11/2000 | Jang et al. | 438/790 |
| 2005/0208726 | A1* | 9/2005 | Chang et al. | 438/303 |

* cited by examiner

*Primary Examiner* — Richard A. Booth

(74) *Attorney, Agent, or Firm* — Ditthavong Mori & Steiner, P.C.

(57) ABSTRACT

Semiconductor devices with high-K/metal gates are formed with spacers that are substantially resistant to subsequent etching to remove an overlying spacer, thereby avoiding replacement and increasing manufacturing throughput. Embodiments include forming a high-K/metal gate, having an upper surface and side surfaces, over a substrate, e.g., a SOI substrate, and sequentially forming, on the side surfaces of the high-K/metal gate, a first spacer of a non-oxide material, a second spacer, of a material different from that of the first spacer, and a third spacer, of a material different from that of the second spacer. After formation of source and drain regions, e.g., epitaxially grown silicon-germanium, the third spacer is etched with an etchant, such as hot phosphoric acid, to which the second spacer is substantially resistant, thereby avoiding replacement.

10 Claims, 7 Drawing Sheets

FABRICATION OF SEMICONDUCTORS WITH HIGH-K/METAL GATE ELECTRODES

TECHNICAL FIELD

The present disclosure relates to a method of fabricating semiconductor devices with high-K/metal gate electrodes. The present disclosure is particularly applicable in fabricating semiconductor devices with high-K/metal gate electrodes and epitaxially grown silicon germanium (and or silicon carbon) source and drain regions.

BACKGROUND

Figure 1:
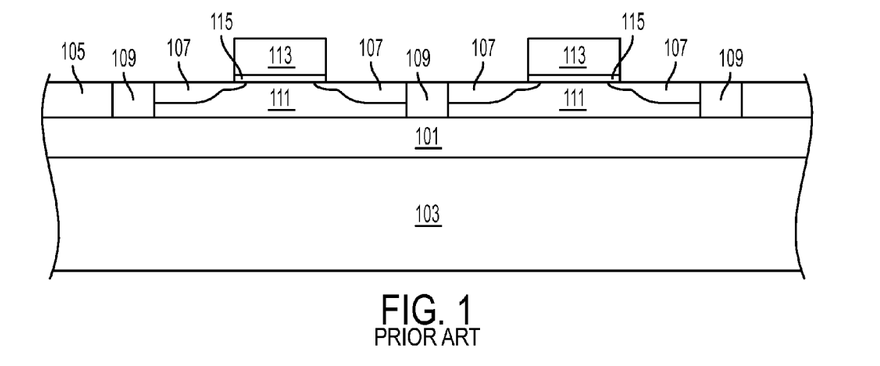
FIG. 1 schematically illustrates a prior art CMOS device on an SOI substrate.

To meet the ever-increasing demands with respect to device and circuit performance, circuit designers have proposed new device architectures. One technique to improve performance of a circuit, for example of a CMOS device, is to fabricate the circuit on a so-called silicon-on-insulator (SOI) substrate, as illustrated in FIG. 1. An SOI substrate comprises an insulating layer 101 formed on a bulk substrate 103, for example, a silicon substrate. The insulating layer is generally formed of silicon dioxide and is sometimes referred to as a buried oxide layer (BOX) layer. Bulk substrate 103 is typically P-doped. An active silicon layer 105 is formed on the insulating layer. Active regions 107 for a field effect transistor device, defined by shallow trench isolation structures 109, are formed in active silicon layer 105. For an N-MOS transistor, the active regions 107 (the source and drain of the transistor) are N-doped and the region 111 between active regions 107 is P-doped. Further, a gate electrode 113, formed on a gate insulation layer 115, is formed on region 111 of active silicon layer 105. The resulting transistor is entirely electrically isolated from the regions surrounding the transistor area.

Gate insulation layers 115 having a high dielectric constant ("high-k"), e.g., having a dielectric constant of about 25 or greater, and metal gate electrodes 113 improve the performance of complementary metal-oxide semiconductor ("CMOS") transistors. High-k gate dielectrics are desirable in small feature size technologies since conventional gate dielectrics, such as silicon dioxide, are too thin and they result in high tunneling current, as well as other problems. Further, metal gate electrodes improve NFET and PFET transistor performance over polysilicon gate electrodes by having a low resistance and by not causing undesirable depletion of carriers at the interface between gate dielectric 115 and channel 111.

Integration of the new device elements to enhance device performance make the integration flow increasingly complicated, resulting in increased costs and new sources of yield degradation. In particular the high-K/metal gate incorporation in the gate electrode not only impacts the downstream processing, but also gets impacted by it. Hence it is important to completely encapsulate the gate electrode using spacers prior to further processing. The spacer scheme has to be compatible with the metal gate as well as with epitaxially grown silicon germanium (eSiGe) integration (and/or silicon carbon) for the source and drain regions and device centering.

Figure 2A:
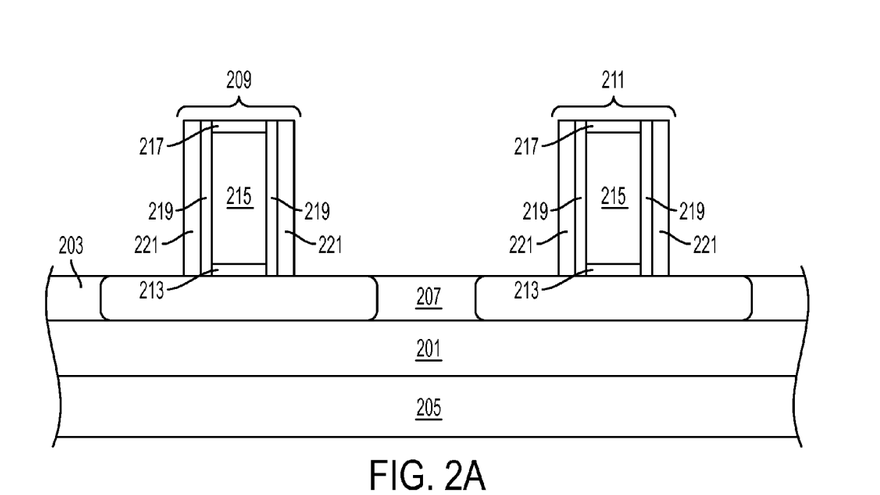
FIGS. 2A-2E schematically illustrate a typical gate first integration of a high-K/metal gate electrode and eSiGe source and drain regions.

A typical gate first integration of the high-K/metal gate electrode involves four main spacers to achieve eSiGe integration and device centering. As illustrated in FIG. 2A, BOX layer 201 and active silicon layer 203 are formed on bulk substrate 205. Shallow trench isolation region 207 is formed in active silicon layer 203 isolating PFET 209 from NFET 211. High-K/metal gate 213, amorphous silicon layer 215, and nitride cap 217 are formed on active silicon layer 203 for PFET 209 and for NFET 211. A first spacer 219 is formed on each side of high-K/metal gate 213, amorphous silicon layer 215, and nitride cap 217. First spacer 219 is a non-oxide spacer to encapsulate the high-K/metal gate electrode 213. A second spacer 221, an oxide spacer which is typically low temperature oxide (LTO) using tetraethyl orthosilicate (TEOS) and ozone as precursors, is formed on first non-oxide spacer 219.

Figure 2B:
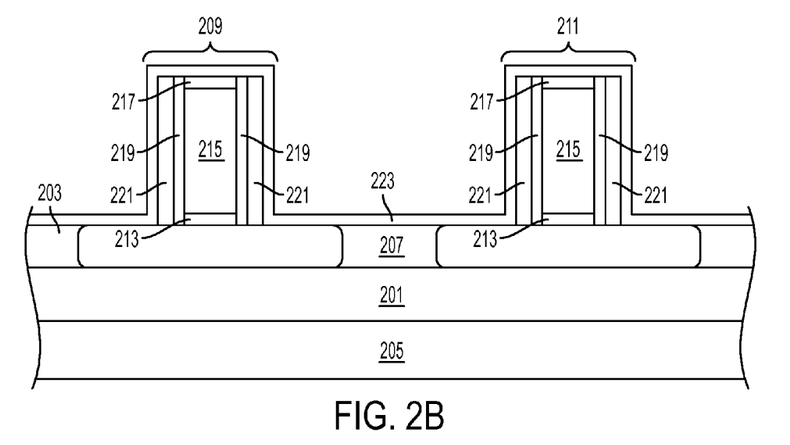
Figure 2C:
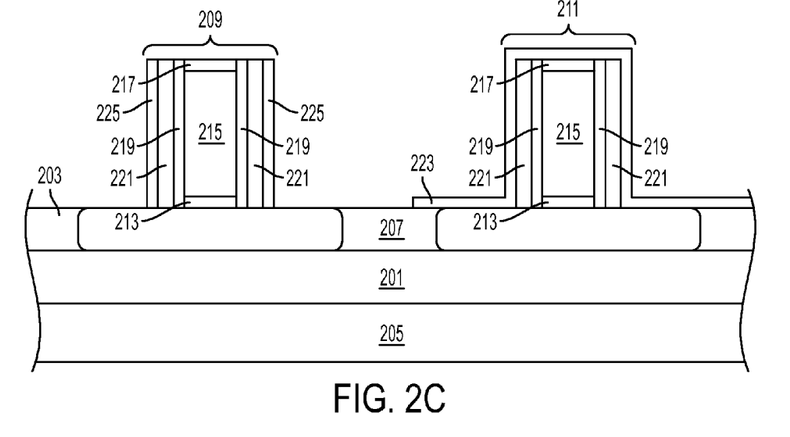

Adverting to FIG. 2B, a nitride layer 223 is formed over silicon layer 203, PFET 209, and NFET 211. The nitride layer is then etched from the top surface of PFET 209 and from active silicon layer 203 near PFET 209, leaving third spacer 225 on second spacer 221, as illustrated in FIG. 2C. Nitride layer 223 remains on NFET 211 as a protection layer for subsequent source and drain formation for PFET 209. The formation of third spacer 225 "pulls down" the first spacers 219 and second spacers 221, as indicated at 227 in FIG. 2D.

Figure 2D:
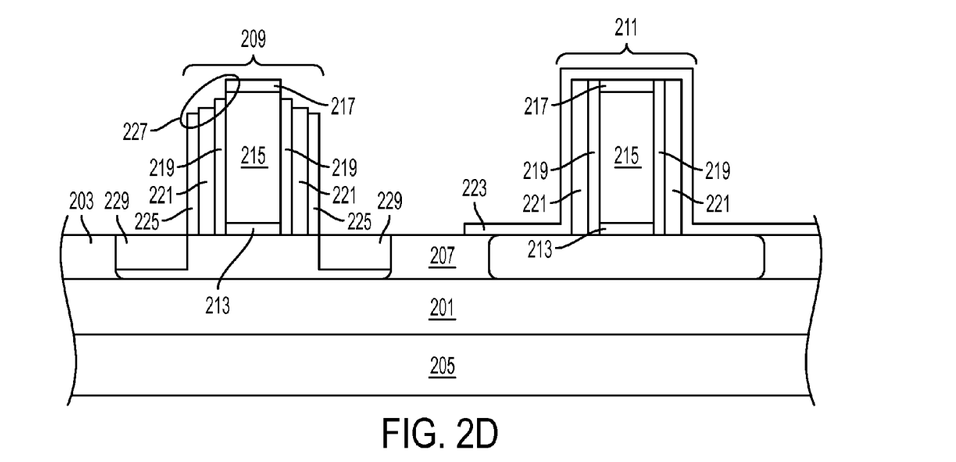
Figure 2E:
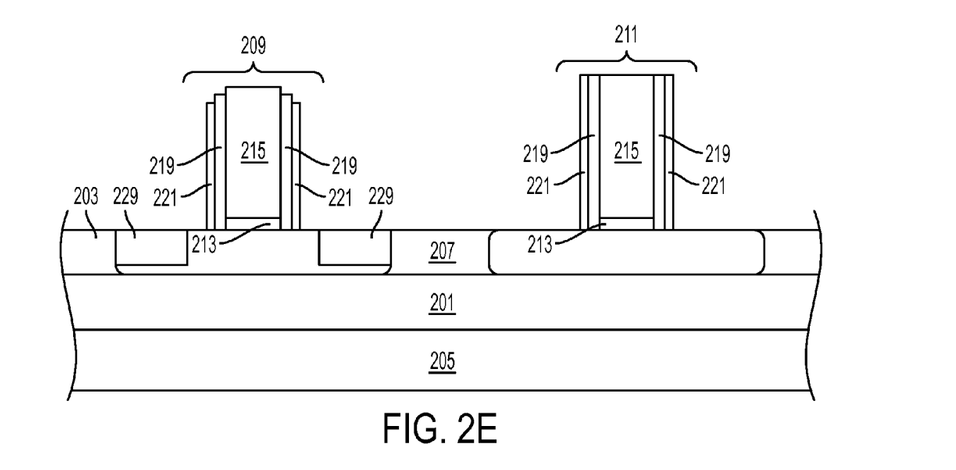

Cavities, defined by third spacers 225, are etched in active silicon layer 203, and silicon germanium (SiGe) is epitaxially grown in the cavities to form source and drain regions 229 for PFET 209, as illustrated in FIG. 2D. After the source and drain regions 229 are formed, third spacers 225, the remaining nitride layer 223, and nitride caps 217 are removed by wet etching, typically using hot phosphoric acid. Adverting to FIG. 2E, it has been found that during removal of the nitride, second LTO spacer 221 is also partially etched. The wet etching causes a change in the dimension of the second LTO spacer 221 that is not controlled. Hence, for reliable centering of the devices (i.e., for controlling the distances from the channel of the device for subsequent implants), the second LTO spacer 221 must be stripped and a new fourth LTO spacer must be formed. However, stripping of the second LTO spacer 221, not only adds extra manufacturing steps, but also causes thinning of first non-oxide spacer 219, thereby decreasing protection of the metal gate.

A need therefore exists for methodology enabling the fabrication of semiconductor devices comprising second spacers that are substantially resistant to nitride etching, such that they need not be removed and replaced and for the resulting improved semiconductor devices having improved protection of the metal gate and improved reliability.

SUMMARY

An aspect of the present disclosure is an efficient method of fabricating a semiconductor device comprising high-K/metal gate electrodes.

Another aspect of the present disclosure is a semiconductor device comprising high-K/metal gate electrodes having and improved reliability.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method comprising: forming a high-K/metal gate, having an upper surface and side surfaces, over a substrate; forming a first spacer of a non-oxide material on the side surfaces of the high-K/metal gate; forming a second spacer, comprising a material different from that of the first spacer, on the first spacer; forming a third spacer, comprising a material different from that of the second spacer, on the second spacer; and etching to remove the third spacer with an etchant to which the second spacer is substantially resistant.

Aspects of the present disclosure include etching to remove the third spacer with hot phosphoric acid as the etchant. Another aspect includes forming the second spacer from a silane derived oxide, using silane and nitrous oxide as precursors, by deposition. Further aspects include controlling deposition parameters for the second spacers such that the second spacer etches no more than 10% of the spacer thickness during the etching of the third spacer. Additional aspects include forming an amorphous silicon layer, having side surfaces, on the upper surface of the high-K/metal gate, and forming the first spacer on the side surfaces of the amorphous silicon layer. Further aspects include forming the high-K/metal gate on SOI substrate. Another aspect includes forming silicon germanium source and drain regions in the SOI substrate by forming a cavity in the SOI substrate on each side of the high-K/metal gate, using the third spacer as a mask, and epitaxially growing silicon germanium in each cavity. Additional aspects include forming the first and third spacers of a material comprising a nitride and the second spacer at a thickness of about 30 angstroms (Å) to about 200 Å.

Another aspect of the present disclosure is a semiconductor device comprising: a substrate; a high-K/metal gate, having an upper surface and side surfaces, over the substrate; a first spacer of a non-oxide material on the side surfaces of the a high-K/metal gate; and a second spacer, comprising a material different from that of the first spacer, on the first spacer, wherein the second spacer comprises a material having substantial resistance to hot phosphoric acid.

Aspects include the second spacer comprising undoped silicon oxide (UDOX). Another aspect includes the second spacer being formed by deposition using silane and nitrous oxide as precursors. Additional aspects include the second spacer comprising an oxide having an etch rate in hot phosphoric acid between about 0.5 Å/min and about 3.5 Å/min. Further aspects include the second spacer having a thickness of about 30 Å to about 200 Å. Other aspects include the substrate comprising a SOI substrate, and silicon germanium source and drain regions being formed in the SOI substrate. Another aspect includes the first and third spacers comprising a nitride.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments.

The present disclosure addresses and solves the problem of spacer degradation during the fabrication of semiconductor devices comprising high-K/metal gate electrodes, the spacer degradation requiring replacement thereby decreasing manufacturing throughput, such as thinning of the second oxide spacer during removal of the third non-oxide spacer. In accordance with embodiments of the present disclosure, the second LTO spacer is replaced with an oxide spacer that is substantially resistant to subsequent etching of an overlying spacer with hot phosphoric acid. As a consequence of using a material for the second spacer that is resistant to such subsequent etching, the second spacers need not be removed and replaced. This in turn avoids the first non-oxide spacers being partially etched during removal of the second spacers, and maintains adequate protection of the gate electrode.

Embodiments of the present disclosure include forming a high-K/metal gate, having an upper surface and side surfaces, over a substrate, such as a SOI substrate, sequentially forming a first spacer of a non-oxide material, e.g., a nitride, on the side surfaces of the high-K/metal gate, a second spacer, comprising a material different from that of the first spacer, on the first spacer, and a third spacer, comprising a material different from that of the second spacer, e.g., a nitride, on the second spacer, and etching to remove the third spacer with an etchant, such as hot phosphoric acid, to which the second spacer is substantially resistant. The second spacer may be formed by deposition from a silane derived oxide, e.g., by using silane and nitrous oxide as precursors, and may be formed at a thickness of about 30 Å to about 200 Å. Deposition parameters for the second spacers may be controlled such that the second spacer etches no more than 10% of the spacer thickness during the etching of the third spacer. In accordance with embodiments of the present disclosure, an amorphous silicon layer, having side surfaces, may be formed on the upper surface of the high-K/metal gate, and the first spacer may be formed on the side surfaces of the amorphous silicon layer. In addition, silicon germanium source and drain regions may be formed in the SOI substrate, e.g., by forming a cavity in the SOI substrate on each side of the high-K/metal gate, using the third spacer as a mask, and epitaxially growing silicon germanium in each cavity.

A semiconductor device in accordance with embodiments of the present disclosure includes a substrate, e.g., a SOI substrate, a high-K/metal gate, having an upper surface and side surfaces, over the substrate, a first spacer of a non-oxide material on the side surfaces of the a high-K/metal gate, and a second spacer on the first spacer, the second spacer being of a material different from that of the first spacer and having substantial resistance to hot phosphoric acid, e.g, an oxide having an etch rate in hot phosphoric acid between about 0.5 Å/min and about 3.5 Å/min. The first and third spacers may be nitrides, and the second spacer may be a UDOX material. The second spacer may be formed by deposition, e.g. to a thickness of about 30 Å to about 200 Å, using silane and nitrous oxide as precursors. In addition, silicon germanium source and drain regions may be formed in the SOI substrate.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 3A:
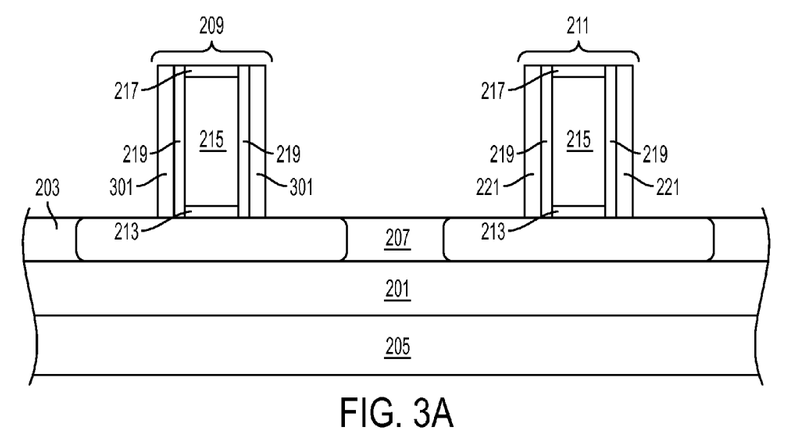
FIGS. 3A-3E schematically illustrate a gate first integration of a high-K/metal gate electrode and eSiGe source and drain regions, according to an exemplary embodiment.

Adverting to FIGS. 3A-3E, a method in accordance with an embodiment of the present disclosure is illustrated. Elements that are the same as in FIGS. 2A-2E have like reference numerals. Like in FIG. 2A, FIG. 3A shows BOX layer 201 and active silicon layer 203 are formed on bulk substrate 205. Shallow trench isolation region 207 is formed in active silicon layer 203 isolating PFET 209 from NFET 211. High-K/metal gate 213, amorphous silicon layer 215, and nitride cap 217 are formed on active silicon layer 203 for PFET 209 and for NFET 211. The high-K/metal gate 213 includes a high-K dielectric, e.g., a hafnium based oxide, a hafnium based oxynitride, or a hafnium-silicon oxynitride, and a metal electrode, e.g., titanium nitride, tantalum nitride, or aluminum nitride, thereon. The gate width for the 32 nanometer (nm) node may be about 300 Å to about 400 Å, e.g., about 300 Å, and for the next node may be about 250 Å. The thickness of the gate electrode is also technology node dependent, and for the 32 nm node, may be about 400 Å to about 600 Å, e.g. about 450 Å.

A first non-oxide spacer 219 is formed on each side of high-K/metal gate 213, amorphous silicon layer 215, and nitride cap 217 to encapsulate the high-K/metal gate electrode 213. First spacer 219 should be free from oxygen, as oxygen reoxidizes the silicon below gate 213, thereby forming a higher dielectric below the gate than at the edge thereof, and oxygen also causes variations in the threshold voltage etc. of the device formed by high-K/metal gate materials. Accordingly, first spacer 219 may be a nitride, e.g., silicon nitride, and may be formed, for example by atomic layer deposition (ALD), plasma enhanced chemical vapor deposition (PECVD), or low pressure chemical vapor deposition (LPCVD). The thickness of first spacer 219 may range from about 10 Å to about 100 Å, e.g., about 30 Å to about 60 Å.

FIG. 3A differs from FIG. 2A in that instead of an LTO second spacer 221, an oxide spacer 301, e.g., UDOX, formed, for example, using silane ($SiH_4$) and nitrous oxide ($N_2O$) as precursors, is formed on first non-oxide spacer 219. Second spacer 301 may have a thickness of about 30 Å to about 200 Å, e.g., about 50 Å to about 100 Å. Deposition parameters, such as temperature, pressure, gas flows, and power settings may be controlled to prevent second spacer 301 from etching more than 10% of the spacer thickness during subsequent etching steps.

Figure 3B:
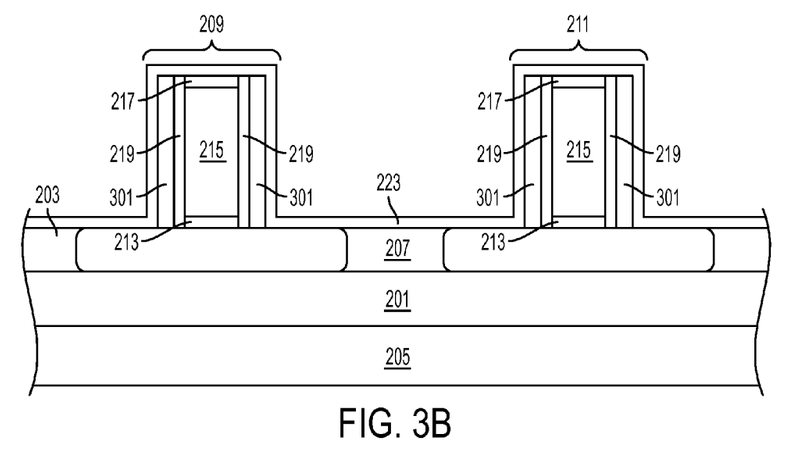
Figure 3C:
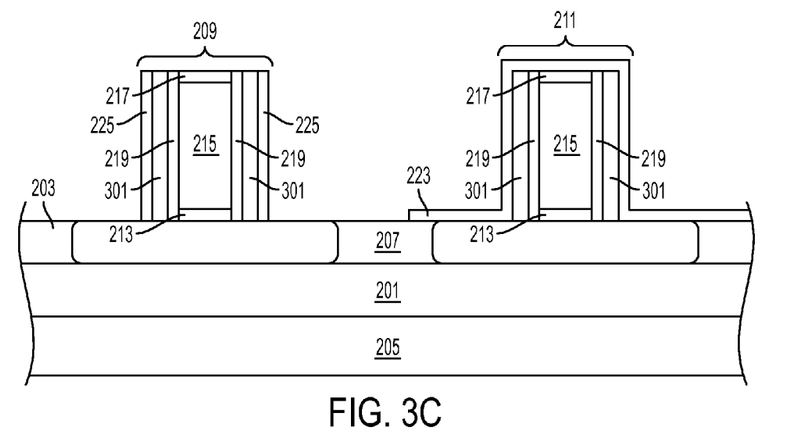

As illustrated in FIG. 3B, nitride layer 223 is formed over silicon layer 203, PFET 209, and NFET 211. The nitride layer is then etched from the top surface of PFET 209 and from active silicon layer 203 near PFET 209, leaving third spacer 225 on second spacer 301, as illustrated in FIG. 3C. Nitride layer 223 remains on NFET 211 as a protection layer for subsequent source and drain formation for PFET 209. The "pull downs" of the first spacers 219 and second spacers 301, as indicated at 303 in FIG. 3D, differ from the pull downs that occur when LTO is employed for the second spacers.

Figure 3D:
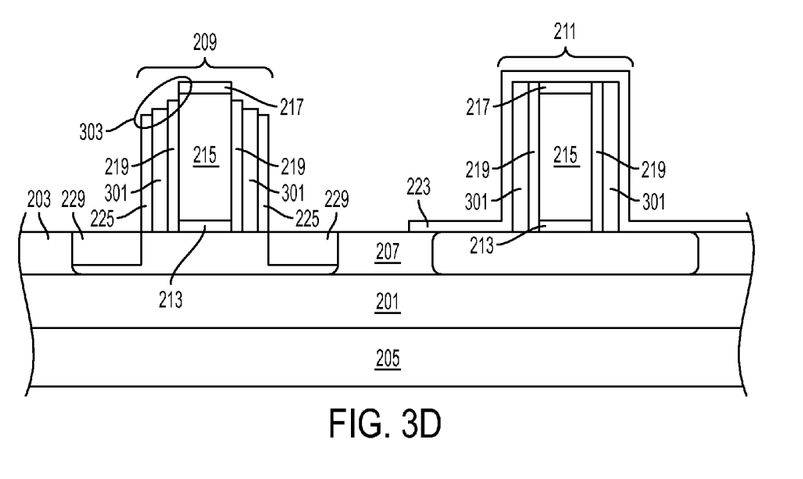

Cavities, defined by third spacers 225, are etched in active silicon layer 203, and SiGe is epitaxially grown in the cavities to form source and drain regions 229 for PFET 209, as illustrated in FIG. 3D. After the source and drain regions 229 are formed, third spacers 225, the remaining nitride layer 223, and nitride caps 217 are removed by wet etching, typically hot phosphoric acid.

Figure 3E:
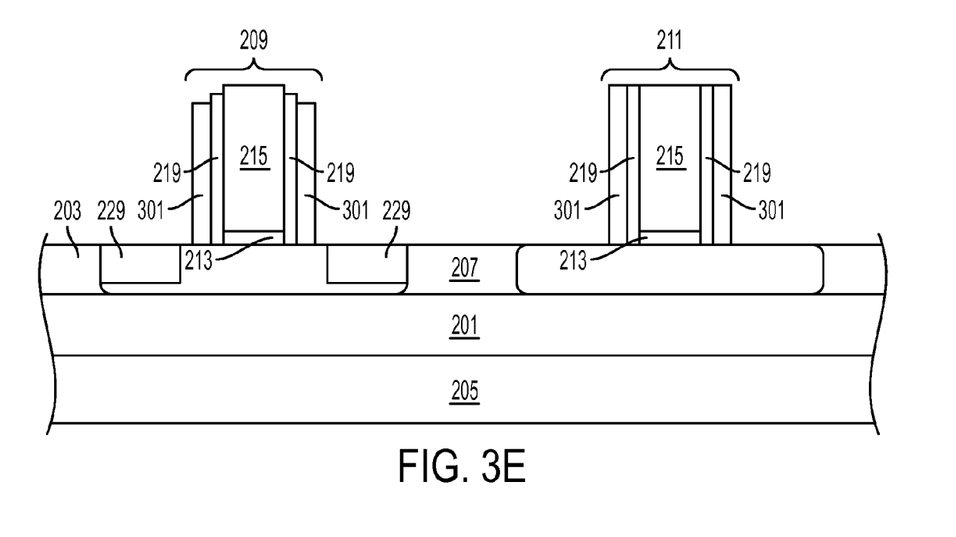

Adverting to FIG. 3E, after the remaining nitride layer 223 and third spacers 225 are etched, second spacers 301 remain substantially the same thickness as before etching the nitride. That occurs because UDOX is much more resistant to hot phosphoric acid than LTO, etching four times slower. Thus, unlike with LTO spacers 221, second spacers 301 need not be removed and replaced.

Although the process is illustrated for the formation of the PFET, subsequently a similar process (not shown) is employed in forming the NFET. Specifically, after formation of the PFET, a nitride layer is deposited over the entire surface and etched from the top surface of NFET 211 and from active silicon layer 203 near NFET 211, leaving a third spacer on second spacer 301. Cavities defined by the third spacer are etched in active silicon layer 203, and silicon carbide (SiC) is epitaxially grown in the cavities to form source and drain regions for NFET 211. Then the third spacer and remaining nitride layer are removed by wet etching. As during formation of the PFET, since second spacer 301 of a UDOX material is employed rather than second spacer 221 of LTO, the second spacer is substantially resistant to the etching of the nitride and, therefore, need not be removed and replaced after etching of the nitride.

Figure 4:
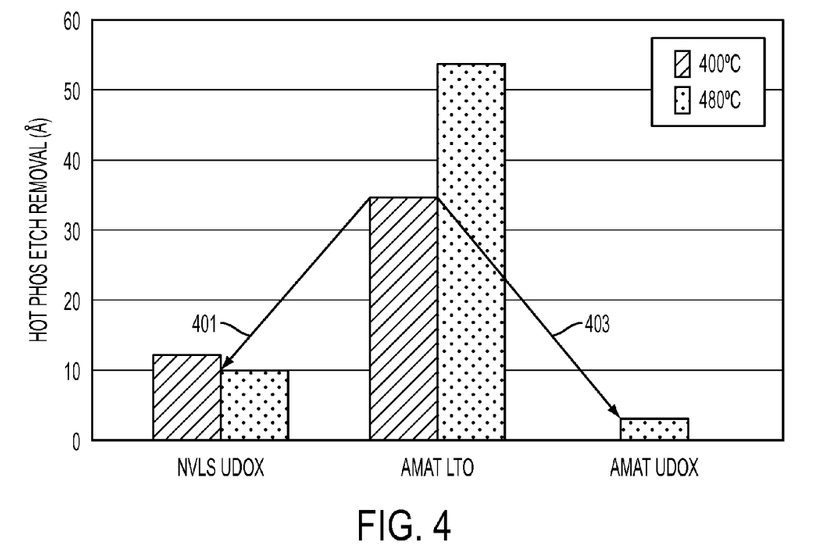
FIG. 4 is graph comparing the etch removal rates of LTO and UDOX materials.

FIG. 4 shows experimental data for the etch removal in angstroms of spacers of three different materials, Novellus (NVLS) UDOX, Applied Materials (AMAT) LTO, and AMAT UDOX. The LTO was deposited by chemical vapor deposition (CVD) using TEOS and ozone as precursors with no additional RF power. The UDOX was deposited by PECVD using $SiH_4$ and $N_2O$ as precursors and RF power to activate the plasma. The NVLS UDOX and AMAT LTO were each deposited at both 400° C. and also at 480° C., and the AMAT UDOX was deposited at 480° C. After etching with hot phosphoric acid, about 34 Å of the 400° C. AMAT LTO and about 54 Å of the 480° C. AMAT LTO were removed. In contrast, only about 12 Å of the 400° C. NVLS UDOX and about 10 Å of the 480° C. NVLS UDOX were removed. Further, only about 3 to 4 Å of the AMAT UDOX were removed. Thus, the NVLS UDOX has about a three time decrease in the amount of oxide that is etched with hot phosphoric acid over the AMAT LTO, as indicated by arrow 401. Further, the AMAT UDOX has about a 10 time decrease in the amount of oxide etched, as indicated by arrow 403. Because of the significant increase in resistance to hot phosphoric acid, UDOX can be used for the second spacers without the extra processing steps of removing and replacing the second spacers after etching the third spacers.

The embodiments of the present disclosure can achieve several technical effects, including eliminating the need for removing and replacing the second spacers after etching with hot phosphoric acid, resulting in reduced process steps, thereby simplifying process flow, and more reliable device centering. Also, since the second spacers are not etched, the first encapsulation spacers are not damaged, and the protection provided by the first spacers for the gate electrode is not impaired. The present disclosure enjoys industrial applicability in fabricating any of various types of highly integrated semiconductor devices with high K/metal gates and epitaxially grown SiGe or SiC source and drain regions.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
forming a high-K/metal gate, having an upper surface and side surfaces, over a substrate;
forming a first spacer of a non-oxide material on the side surfaces of the high-K/metal gate;
forming a second spacer, comprising a material different from that of the first spacer, on the first spacer;
forming a third spacer, comprising a material different from that of the second spacer, on the second spacer;
forming silicon germanium source and drain regions in the substrate by:
   forming a cavity in the substrate on each side of the high-K/metal gate, using the third spacer as a mask; and
   epitaxially growing silicon germanium in each cavity; and
etching to remove the third spacer with an etchant to which the second spacer is substantially resistant.

2. The method according to claim 1, comprising etching to remove the third spacer with hot phosphoric acid as the etchant.

3. The method according to claim 1, comprising forming the second spacer from a silane derived oxide by deposition.

4. The method according to claim 3, comprising depositing the second spacers using silane and nitrous oxide as precursors.

5. The method according to claim 3, further comprising controlling deposition parameters for the second spacers such that the second spacer etches no more than 10% of the spacer thickness during the etching of the third spacer.

6. The method according to claim 1, further comprising:
forming an amorphous silicon layer, having side surfaces, on the upper surface of the high-K/metal gate; and
forming the first spacer on the side surfaces of the amorphous silicon layer.

7. The method according to claim 1, comprising forming the high-K/metal gate on a silicon-on-insulator (SOI) substrate.

8. The method according to claim 1, comprising forming the first and third spacers of a material comprising a nitride.

9. The method according to claim 1, comprising forming the second spacer at a thickness of about 30 Å to about 200 Å.

10. A method comprising:
forming a high-K/metal gate on a SOI substrate;
forming an amorphous silicon layer on the high-K/metal gate, the gate and the amorphous silicon layer having side surfaces;
forming a non-oxide nitride first spacer on the side surfaces;
forming an oxide second spacer by deposition using silane and nitrous oxide as precursors, on the first spacer;
forming a nitride third spacer on the second spacer;
forming a cavity in the SOI substrate on each side of the high-K/metal gate, using the nitride third spacer as a mask;
epitaxially growing silicon germanium in each cavity, to form source and drain regions in the SOI substrate; and
etching to remove the nitride third spacer with hot phosphoric acid, wherein the second spacer exhibits substantial resistance to hot phosphoric acid.

* * * * *